(12) United States Patent
Kozuki et al.

(10) Patent No.: US 9,526,181 B2
(45) Date of Patent: Dec. 20, 2016

(54) ELECTRONIC DEVICE AND METHOD OF MANUFACTURING ELECTRONIC DEVICE

(71) Applicant: SEIKO INSTRUMENTS INC., Chiba-shi, Chiba (JP)

(72) Inventors: Atsushi Kozuki, Chiba (JP); Hideshi Hamada, Chiba (JP); Yoshifumi Yoshida, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 171 days.

(21) Appl. No.: 14/519,327

(22) Filed: Oct. 21, 2014

(65) Prior Publication Data

US 2015/0116971 A1    Apr. 30, 2015

(30) Foreign Application Priority Data

Oct. 25, 2013 (JP) ................... 2013-222588

(51) Int. Cl.
| | |
|---|---|
| *H01R 9/00* | (2006.01) |
| *H05K 3/24* | (2006.01) |
| *H05K 1/11* | (2006.01) |
| *H05K 1/09* | (2006.01) |

(52) U.S. Cl.
CPC .............. *H05K 3/247* (2013.01); *H05K 1/113* (2013.01); *H01L 2224/16225* (2013.01); *H01L 2924/16152* (2013.01); *H05K 1/092* (2013.01); *H05K 2201/035* (2013.01)

(58) Field of Classification Search
USPC ................................. 361/774, 772, 775, 773
See application file for complete search history.

(56) References Cited

U.S. PATENT DOCUMENTS

| 6,340,606 B1* | 1/2002 | Hashimoto ........... H01L 21/486 257/778 |
|---|---|---|
| 7,872,874 B2* | 1/2011 | Karasawa .............. H05K 1/111 361/767 |

\* cited by examiner

*Primary Examiner* — Andargie M Aychillhum
(74) *Attorney, Agent, or Firm* — Adams & Wilks

(57) ABSTRACT

An electronic device of the present invention includes an insulating base substrate in which a plurality of through electrodes are formed, an electronic element which is electrically connected to the through electrodes and is mounted on one surface of the base substrate, a lid which accommodates the electronic element and is bonded to the one surface of the base substrate, and an external electrode which covers a region from an end face of the through electrode, which is exposed by the other surface of the base substrate, to the other surface in the vicinity of the end face. The external electrode includes a conductive film which covers a region ranging from the end face to the other surface in the vicinity of the end face, and a paste film which covers a surface of the conductive film and is formed of a conductive paste. The paste film is formed by a printing method and is formed of tin or a tin alloy.

3 Claims, 6 Drawing Sheets

ELECTRONIC DEVICE AND METHOD OF MANUFACTURING ELECTRONIC DEVICE

BACKGROUND OF THE INVENTION

Field of the Invention

The present invention relates to an electronic device that accommodates an electronic element in a package, and a method of manufacturing an electronic device.

Background Art

Hitherto, surface-mounted electronic devices have generally been used for mobile phone and mobile information terminals. Meanwhile, in crystal vibrators, micro electro mechanical systems (MEMS), gyroscopes, acceleration sensors, and the like, a hollow cavity is formed inside a package, and an electronic element such as a crystal vibrator and a MEMS is enclosed in the cavity. A glass material is used as the package. For example, the electronic element is mounted on a base substrate, and a glass lid is bonded thereto by anodic bonding, thereby sealing the electronic element. Anodic bonding between glass materials has the advantages of high air tightness and low costs (JP-A-2011-155506).

FIG. 6 is a cross-sectional view of this type of electronic device (FIG. 1 of JP-A-2011-155506). An electronic device 101 includes a base 110, an electronic component 140 mounted on the base 110, and a cap 150 which accommodates the electronic component 140 and is bonded to the base 110. The base 110 is provided with a through electrode 121 passing through the base in a through-thickness direction, a first metal film 122 which is electrically connected to the through electrode 121, and a circuit pattern 130 and a second metal film 123 which electrically connect the through electrode 121 and the electronic component 140 to each other. An external electrode 160 formed of a metal film is formed outside the first metal film 122.

Here, a nickel-iron alloy is used as the through electrode 121. Gold formed by an electroless plating method is used as the first metal film 122. In addition, a low melting point glass, not shown in the drawing, is used between the through electrode 121 and base 110 to improve air tightness by thermal welding.

SUMMARY OF THE INVENTION

In this type of electronic device, a nickel-iron alloy is used as the through electrode 121, and a gold thin film is used as the first metal film 122 for preventing the through electrode 121 from oxidizing. Further, the external electrode 160 is mostly formed of a conductive adhesive such as a conductive paste. When the external electrode 160 is formed of a conductive adhesive such as a silver paste, it is difficult to completely block moisture due to an insufficient humidity resistance of the conductive paste. There is a great difference in ionization tendency between a nickel-iron alloy and gold. Accordingly, when moisture and the like are attached between the through electrode 121 and the first metal film 122, the through electrode 121 corrodes due to a battery effect, which causes a decrease in conductivity. In addition, a low melting point glass is used between the through electrode 121 and the base 110, and a gold thin film of the first metal film 122 is formed on an end face of the through electrode 121 by an electroless plating method. Since a gold thin film is not likely to be formed in the low melting point glass by an electroless plating method, a boundary portion between the through electrode 121 and the first metal film 122 is exposed, and thus there is a tendency for corrosion to progress.

According to an aspect of the present invention, there is provided an electronic device including an insulating base substrate in which a plurality of through electrodes are formed, an electronic element which is electrically connected to the through electrodes and is mounted on one surface of the base substrate, a lid which accommodates the electronic element and is bonded to the one surface of the base substrate, and an external electrode which covers a region from an end face of the through electrode, which is exposed by the other surface of the base substrate, to the other surface in the vicinity of the end face. The external electrode includes a conductive film which covers a region ranging from the end face to the other surface in the vicinity of the end face, and a paste film which covers a surface of the conductive film and is formed of a conductive paste. The paste film is formed by a printing method and is formed of tin or a tin alloy.

In the aspect, the through electrode may be formed of a nickel-iron alloy.

In the aspect, a side surface of the conductive film may be covered with the paste film.

In the aspect, the paste film may be formed to have a thickness of 10 μm to 30 μm.

According to another aspect of the present invention, there is provided a method of manufacturing an electronic device, the method including a through electrode forming process of forming a through electrode in an insulating base substrate; an electronic element mounting process of mounting an electronic element, which is electrically connected to the through electrode, on one surface of the base substrate; a lid installation process of bonding a lid accommodating the electronic element to the one surface of the base substrate; a conductive film forming process of forming a conductive film so as to cover an end face of the through electrode exposed by the other surface of the base substrate and the other surface of the base substrate located in a vicinity of the end face; and a paste film forming process of forming a paste film, covering a surface of the conductive film, out of a conductive paste constituted by tin or a tin alloy using a printing method.

In the aspect, the through electrode may be formed of a nickel-iron alloy in the through electrode forming process.

In the aspect, the surface of the conductive film and a side surface of the conductive film may be covered with the paste film in the paste film forming process.

In the aspect, the paste film may be formed to have a thickness of 10 μm to 30 μm in the paste film forming process.

In the aspect, the method may further include, before the conductive film forming process, a grinding process of grinding or polishing the other surface of the base substrate so that the end face of the through electrode and the other surface of the base substrate are formed to be flush with each other and of removing an oxide film formed on the end face.

According to the present invention, it is possible to block the permeation of moisture between a through electrode and an insulating base substrate to thereby prevent the occurrence of corrosion. In addition, since gold is not used for an external electrode, it is possible to prevent the occurrence of corrosion due to a battery effect.

In addition, since a paste film is formed of tin or a tin alloy having flexibility, it is possible to prevent the through electrode from corroding and to reduce stress occurring in the base substrate. In addition, at the time of mounting on an external component, it is possible to easily perform soldering.

DETAILED DESCRIPTION OF THE INVENTION

Figure 1:
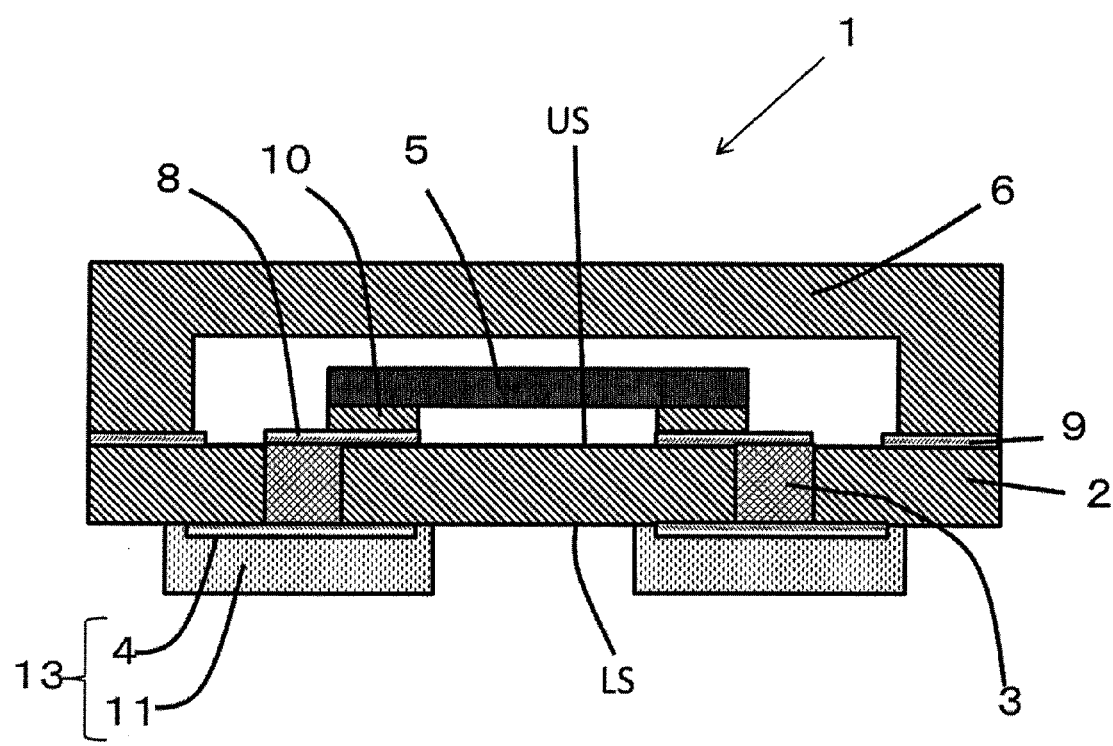
FIG. 1 is a schematic cross-sectional view of an electronic device according to the present invention.

FIG. 1 is a schematic cross-sectional view of an electronic device 1 according to the present invention. The electronic device 1 includes a base substrate 2, a lid 6 which is bonded thereto, and an electronic element 5 which is accommodated therein. The base substrate 2 has an insulation property and includes a plurality of through electrodes 3 which pass through the base substrate from one surface US to the other surface LS. A wiring electrode 8 is formed on one surface US of the base substrate 2 so as to cover end faces of the through electrodes 3, and an electronic element 5 is mounted on the wiring electrode 8 through a metal bump 10. The lid 6 has a dent in the center thereof, accommodates the electronic element 5 in the dent thereof, and is bonded to one surface US of the base substrate 2 through a bonding material 9. The electronic device 1 further includes external electrodes 13 each of which covers a region ranging from the end face of the through electrode 3 which is exposed by the other surface LS of the base substrate 2 to the other surface LS in the vicinity of the end face. The external electrode 13 includes a conductive film 4 which covers a region ranging from the end face to the other surface in the vicinity of the end face, and a paste film which covers the surface of the conductive film 4 and is formed of a conductive paste.

In this manner, the end face, which is exposed by the other surface LS of the through electrode 3 formed in the base substrate 2, and the other surface LS near the vicinity are completely covered with the conductive film 4, and the surface including the top surface and the side surface of the conductive film 4 is covered with the paste film. For this reason, the through electrode 3 does not come into contact with moisture and the like, and thus corrosion is prevented.

Glass, ceramics, plastic, a glass epoxy resin, or the like can be used as the base substrate 2. A piezoelectric vibration piece, a MEMS, an acceleration sensor, a light-emitting element, a light-receiving element, and other semiconductor elements can be used as the electronic element 5.

A nickel-iron alloy such as Kovar, Invar, Permalloy, 42 alloy, or stainless steel and other metal materials can be used as the through electrode 3.

A metal film formed of tin or a tin alloy is used as the paste film 11. Based on this configuration, it is possible to prevent the through electrode 3 from corroding. Further, since the paste film 11 is formed of tin or a tin alloy having flexibility, it is possible to reduce stress occurring in the base substrate. In addition, at the time of mounting on an external component, it is possible to easily perform soldering. In addition, it is preferable that the paste film 11 be formed to have a thickness of 10 µm to 30 µm. When the thickness of the paste film 11 is equal to or greater than 10 µm, it is possible to reliably prevent the through electrode 3 from being exposed. In addition, when the thickness of the paste film 11 is equal to or less than 30 µm, it is possible to reliably obtain an effect of reducing stress occurring in the base substrate 2. In addition, the paste film 11 is formed so as to cover the surface of the conductive film 4 by a printing method. At this time, the paste film 11 covers both the upper surface and the side surface of the conductive film 4. Thus, the entirety of the conductive film 4 covering the through electrode 3 is covered with the paste film 11 and is not exposed. Accordingly, it is possible to further prevent the through electrode 3 from corroding than in a case where the entire conductive film 4 is not covered. Meanwhile, the paste film 11 does not necessarily cover the side surface of the conductive film 4, and may cover a portion thereof or may not cover the conductive film.

The conductive film 4 is used as a base film of the paste film. In addition, it is possible to use a metal film such as a titanium film, a nickel film, or a copper film as the conductive film 4. When a metal film is used as the conductive film 4, a material having good adhesiveness with respect to the end face of the through electrode 3 and the base substrate 2 is adopted. In addition, it is preferable that a material having a small difference in ionization tendency be adopted with respect to the metal film to be formed on the conductive film 4. In addition, it is preferable that the conductive film 4 be deposited to have a thickness of 0.05 µm to 0.5 µm. When the thickness of the conductive film 4 is equal to or greater than 0.05 µm, it is possible to prevent the conductive film 4 from being melt and peeled during electrolytic plating. In addition, when the thickness of the conductive film 4 is equal to or greater than 0.5 µm, there is the possibility of the conductive film being not likely to be formed depending on the formation method thereof.

Meanwhile, the conductive film 4 may further include a first conductive film which is constituted by a metal film formed on the end face of the through electrode 3 by electroless plating, electrolytic plating, or the like or a metal film formed on the end face of the through electrode 3 and formed in the vicinity of the end face by vapor deposition or sputtering, and a second conductive film which is constituted by a titanium film, a nickel film, or a copper film formed on a first layer. The first conductive film is formed of gold, nickel, copper, titanium, chromium, or the like.

Figure 2:
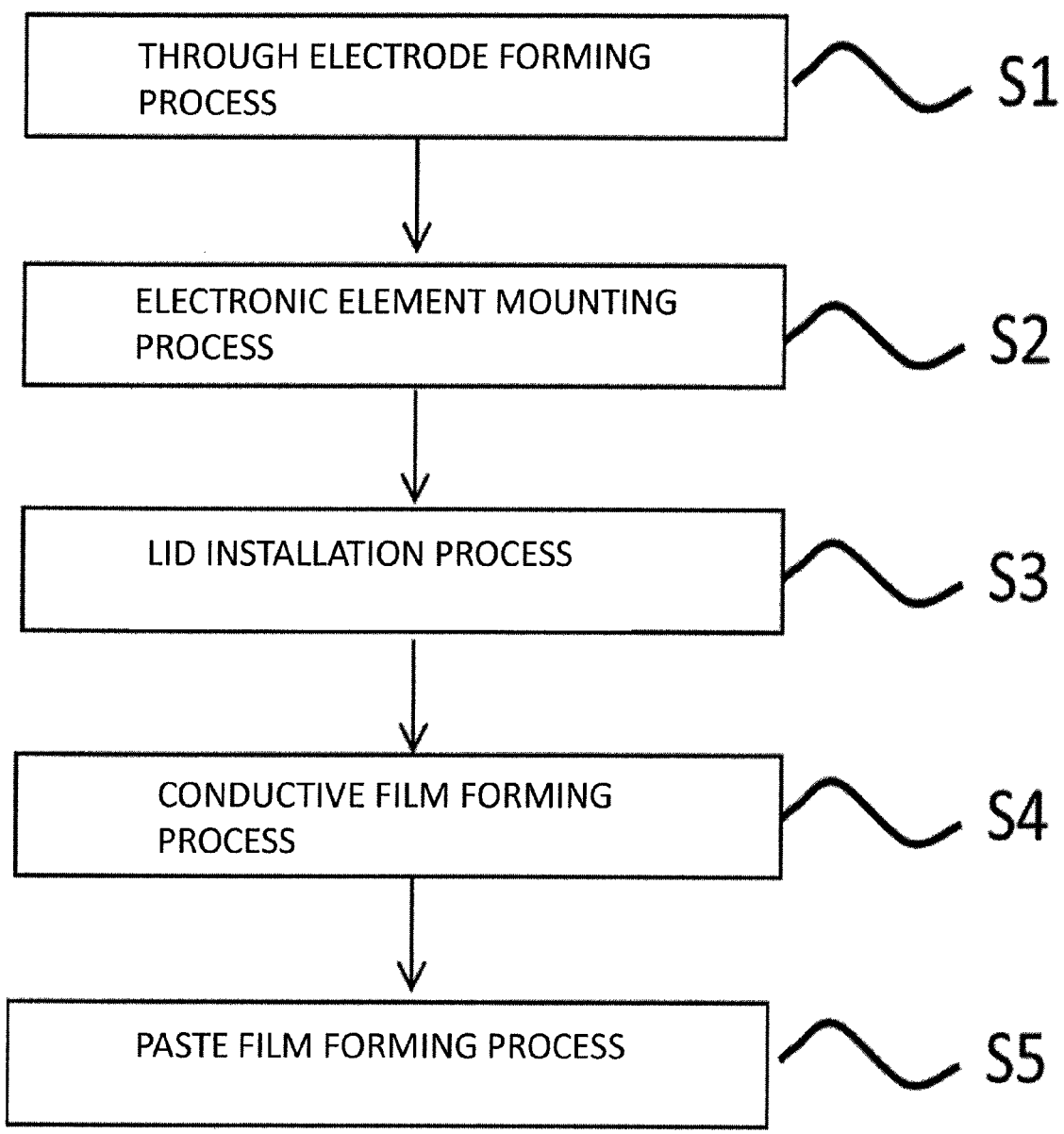
FIG. 2 is a process diagram illustrating a method of manufacturing an electronic device according to the present invention.

FIG. 2 is a process diagram illustrating a method of manufacturing an electronic device according to the present invention. FIGS. 3A to 3C and FIGS. 4A and 4B are diagrams illustrating processes in a method of manufacturing an electronic device according to the present invention. The same components or components having the same functions will be denoted by the same reference numerals.

As shown in FIG. 2, the method of manufacturing an electronic device of the present invention includes a through electrode forming process S1, an electronic element mounting process S2, a lid installation process S3, a conductive film forming process S4, and a paste film forming process S5. In the through electrode forming process S1, a through electrode is formed in an insulating base substrate in a through-thickness direction. In the electronic element mounting process S2, an electronic element is mounted on one surface of the base substrate. In the lid installation process S3, a lid accommodating the electronic element is bonded to the base substrate. In the conductive film forming process S4, a conductive film is formed on the other surface of the base substrate and an end face of the through electrode which is exposed by the other surface. In the paste film forming process S5, an external electrode is formed of the paste film 11 on the surface of the conductive film by a printing method or the like. A process of forming the external electrode of this embodiment includes the conductive film forming process S4 and the paste film forming process S5.

Meanwhile, the manufacturing method of the present invention may include forming the conductive film on the other surface of the base substrate by the conductive film forming process S4, performing the paste film forming process S5, mounting the electronic element on one surface of the base substrate in the electronic element mounting process S2, and lastly performing the lid installation process S3, after the through electrode forming process S1 and before the electronic element mounting process S2. In addition, the method can further include a grinding process of grinding or polishing the other surface of the base substrate 2 so that the end face of the through electrode and the other surface of the base substrate are flush with each other and so that an oxide film formed in the end face is removed, after the lid installation process S3 and before the conductive film forming process S4.

Thus, it is possible to prevent conductivity between the conductive film and the through electrode from being decreased, which will be described below in detail.

Figure 3A:
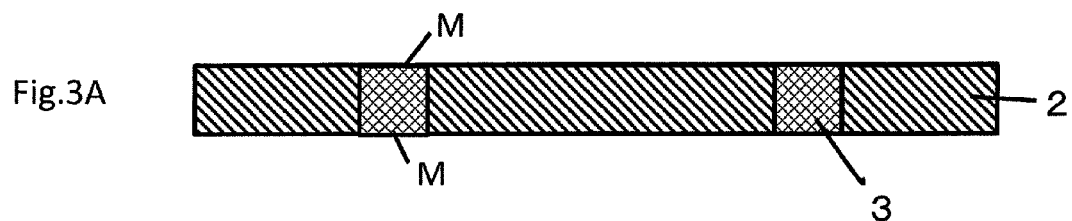
FIGS. 3A to 3C are diagrams illustrating a process of manufacturing an electronic device according to the present invention.

FIG. 3A is a schematic cross-sectional view showing a state where the through electrodes 3 are formed in the insulating base substrate 2 in the through electrode forming process S1. An insulating substrate, such as, for example, a glass substrate, a plastic substrate, or a glass epoxy resin substrate can be used as the base substrate 2. A nickel-iron alloy such as Kovar, Invar, Permalloy, 42 alloy, or stainless steel and other metal materials can be used as the through electrode 3. The use of a glass substrate as the base substrate 2 and the use of Kovar as the through electrode 3 can allow a package with high reliability to be formed due to their approximate thermal expansion coefficients. Hereinafter, a description will be given of an example in which a glass substrate is used as the base substrate 2 and a nickel-iron alloy is used as the through electrode 3.

The base substrate 2 formed of glass is softened and melted, and a through hole is formed by die forming. A wire rod of a nickel-iron alloy is filled in the through hole, and heating and softening are performed to weld the wire rod and the glass together. After the glass is cooled, both faces thereof are polished to be flattened. Then, an oxide film is removed by exposing an end face M of the through electrode 3, and the end face M and the surface of the base substrate 2 are formed to be flush with each other. The thickness of the flattened base substrate 2 is, for example, 0.2 mm to 1 mm. Meanwhile, the through hole of the base substrate 2 can also be formed by a sandblasting method or an etching method.

Figure 3B:
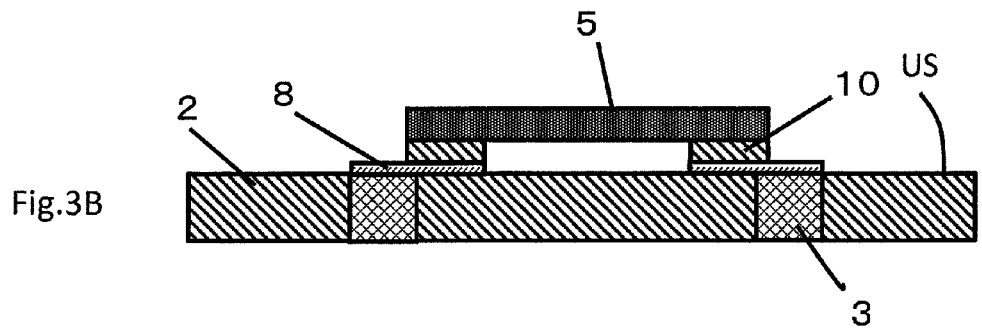

FIG. 3B is a schematic cross-sectional view showing a state where the electronic element 5 is mounted on the base substrate 2 in the electronic element mounting process S2. A metal film is formed on the one surface US by a vapor deposition method, a sputtering method, or the like, and the metal film is patterned by photolithography and an etching method, thereby forming the wiring electrode 8. The wiring electrode 8 may be formed by a printing method, in addition to a vapor deposition method and a sputtering method. Next, the electronic element 5 is installed on the base substrate 2 through the metal bump 10 by surface mounting. Instead of the surface mounting, the electronic element 5 may be attached to the surface of the base substrate 2 using an adhesive or the like, and the wiring electrode 8 and the electronic element 5 may be electrically connected to each other by wire bonding.

Figure 3C:
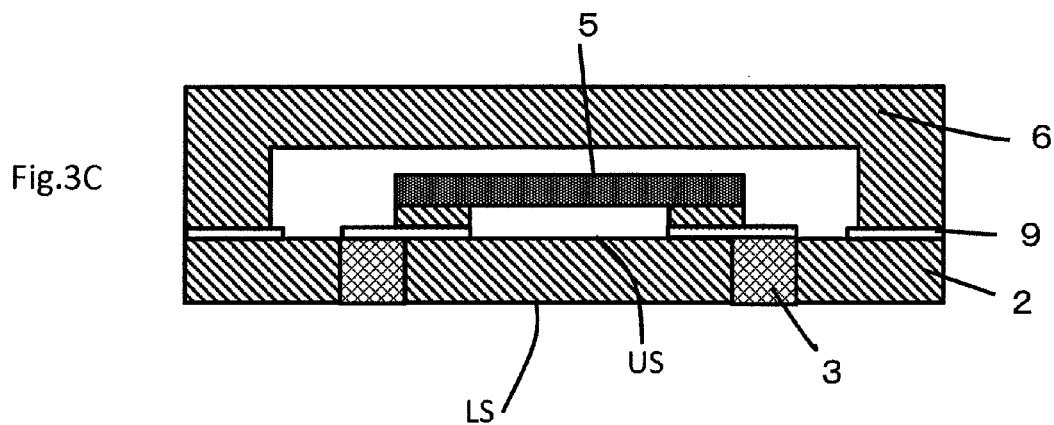

FIG. 3C is a schematic cross-sectional view showing a state where a lid 6 is bonded to one surface US of the base substrate 2 in the lid installation process S3. The same material as that of the base substrate 2, for example, a glass material can be used as the lid 6. The lid 6 has a dent in the center thereof, and the bonding material 9 is formed in advance on the upper end face of the dent. A conductive film such as an aluminum film, a chromium film, or a silicon film or a composite layer thereof is formed as the bonding material 9 by, for example, a vapor deposition method or a sputtering method. Then, the electronic element 5 is accommodated in the central dent, and the base substrate 2 and the lid 6 are bonded to each other by anodic bonding. The setting of the vicinity to be in a vacuum state at the time of the bonding can allow the inside of the package accommodating the electronic element 5 to be vacuumized. For example, when a crystal vibration piece is used as the electronic element 5, the maintaining of the inside of the package in a vacuum state can allow air resistance against the physical vibration of the crystal vibration piece to be eliminated. Meanwhile, the base substrate 2 and the lid 6 can be bonded to each other using intermetallic bonding or an adhesive depending on the intended use, in addition to using anodic bonding.

Figure 4A:
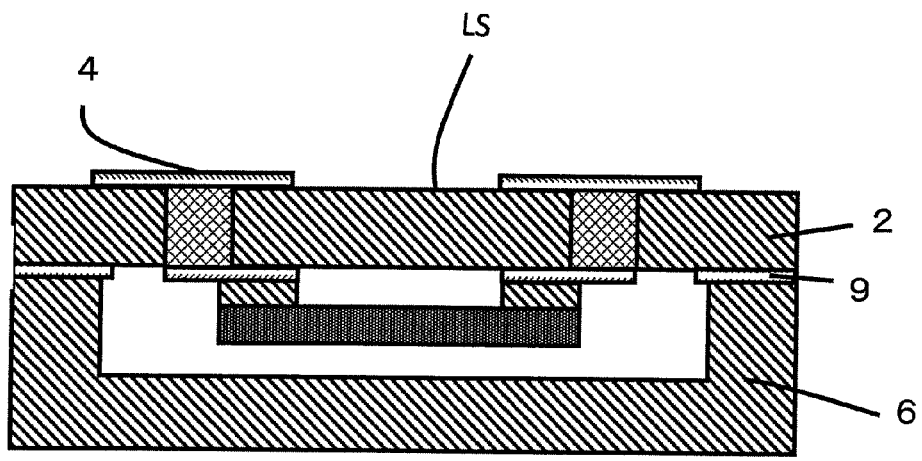
FIGS. 4A and 4B are diagrams illustrating a process of manufacturing an electronic device according to the present invention.

FIG. 4A is a schematic cross-sectional view showing a state where the conductive film 4 is formed on the other surface LS of the base substrate 2 in the conductive film forming process S4. The oxide film of the end face M is removed by polishing or cleaning the other surface LS of the base substrate 2. Next, the conductive film 4 formed of a metal is deposited on the other surface LS by a vapor deposition method or a sputtering method. In this embodiment, the conductive film 4 is deposited to have a thickness of 0.05 μm to 0.5 μm. The conductive film 4 is deposited on the entirety of the other surface LS across the end faces M of the plurality of through electrodes 3. In addition to a titanium film, a metal film such as a nickel film or a copper film can be used as the conductive film 4. When the metal film is used as the conductive film 4, a material having good adhesiveness with respect to the end face M and the base substrate 2 is adopted. In addition, it is preferable that a material having a small difference in ionization tendency be adopted with respect to the metal film to be formed on the conductive film 4.

Meanwhile, the metal film may be formed by performing electroless plating on the end face of the through electrode and by performing vapor deposition, sputtering, electrolytic plating, or the like on the vicinity of the end face, before forming the conductive film 4. A main metal to be processed includes gold, copper, titanium, chromium, and the like.

Figure 4B:
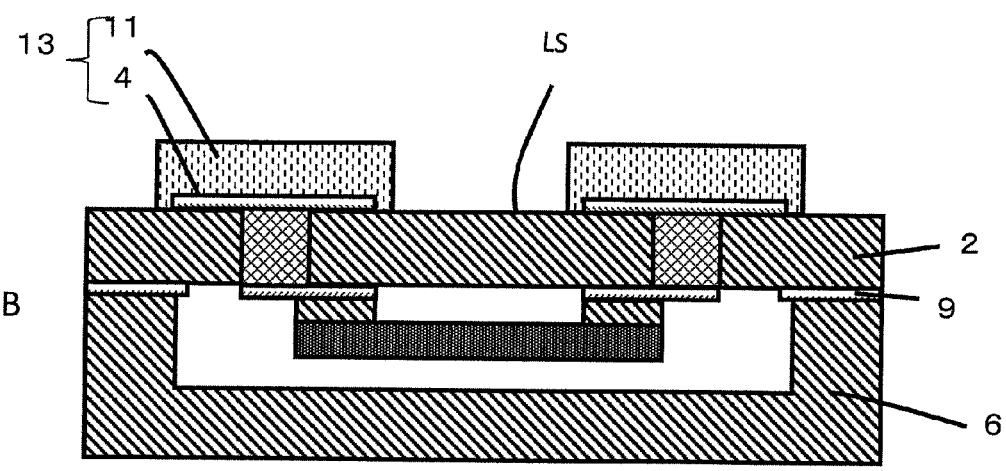

FIG. 4B is a schematic cross-sectional view showing a state where the paste film 11 formed of a conductive paste is deposited on the surface of the conductive film 4 in the paste film forming process S5. A portion of the surface of the conductive film 4 other than an electrode pattern-formed portion is masked by a metal mask, a mesh mask, or the like, and a paste film is deposited thereon by a printing method, thereby forming the external electrode 13. The paste film 11 is formed so as to cover an exposed surface of the conductive film 4 which is exposed by the other surface LS side. The paste film 11 is formed to have a thickness of 10 μm to 30 μm. A metal film formed of tin or a tin alloy is formed as the paste film 11. Since the paste film 11 is formed by a printing method, it is possible to easily increase the film thickness. For this reason, it is possible to further prevent the through electrode 3 from corroding. Meanwhile, the film thickness of each of the external electrodes 13 can be appropriately adjusted depending on a material or the like of the conductive film as long as an effect of preventing the through electrode 3 from corroding can be obtained.

Figure 5:
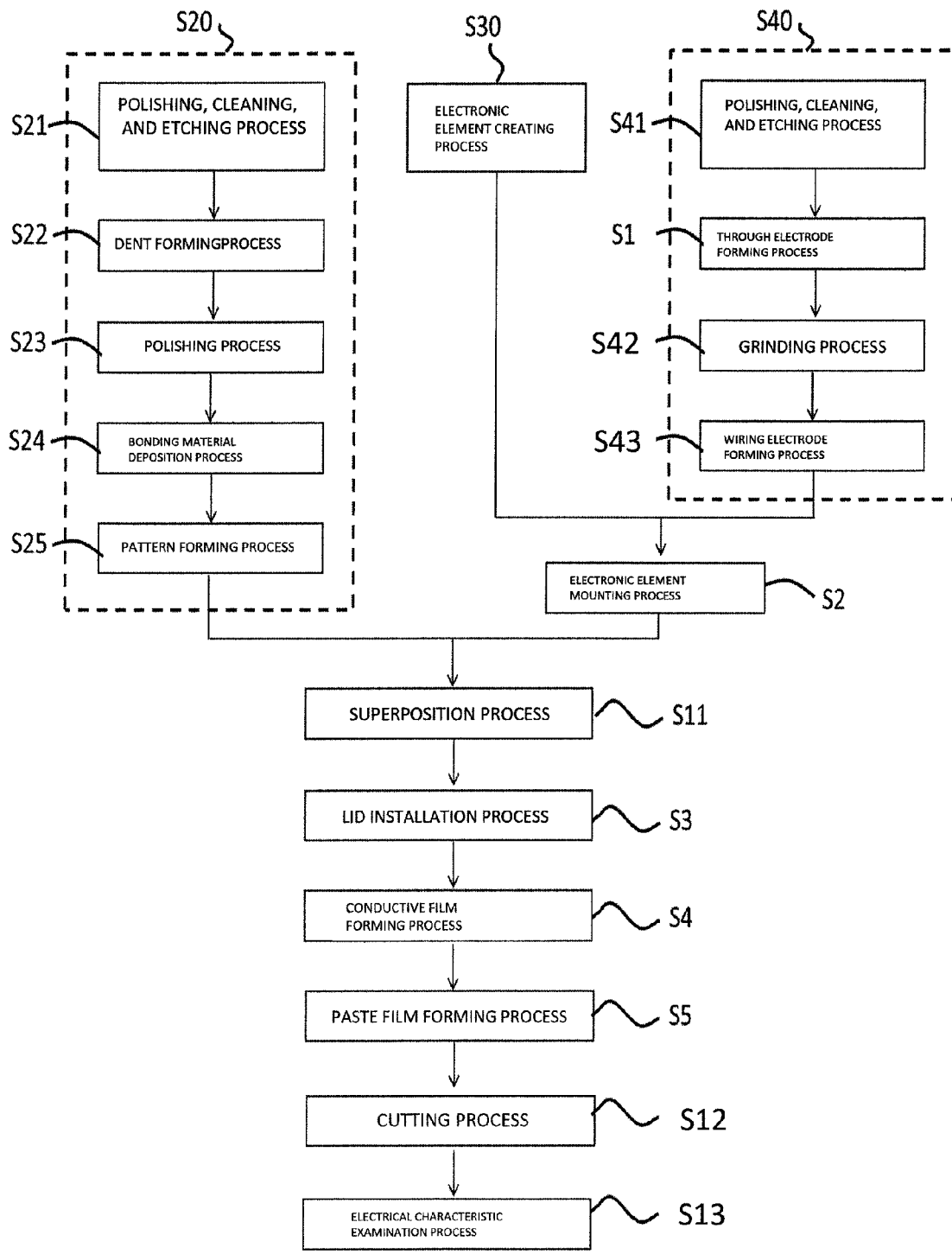
FIG. 5 is a process diagram illustrating a method of manufacturing an electronic device according to the present invention.
Figure 6:
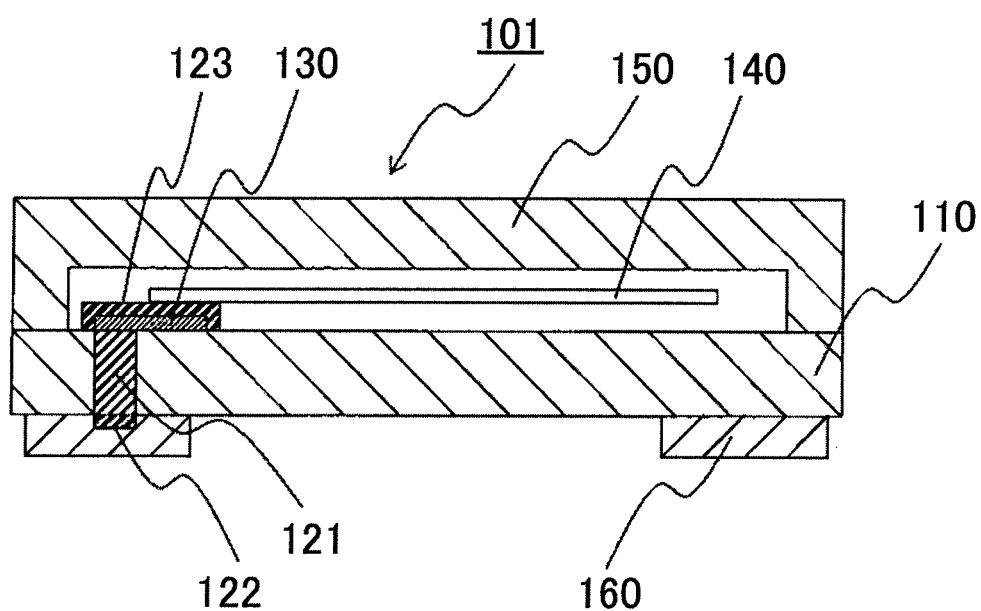
FIG. 6 is a cross-sectional view of an electronic device which is well known in the related art.

FIG. 5 is a process diagram illustrating a method of manufacturing an electronic device according to the present invention, which shows a specific example in which an electronic device having an electronic element MEMS mounted thereon is manufactured. Meanwhile, this embodiment illustrates a manufacturing method of bonding a glass wafer provided with a plurality of dents and a glass wafer having a plurality of electronic elements mounted thereon to each other in an overlapping manner and of simultaneously forming the plurality of electronic devices 1. The same processes will be denoted by the same reference numerals and signs.

The electronic element mounted on the base substrate is an element such as a MEMS. A lid forming process S20 will be described below. A plate-shaped glass wafer formed of soda-lime glass is prepared. First, in a polishing, cleaning, and etching process S21, the glass wafer is polished to have a predetermined thickness and is cleaned, and then an etching process is performed to remove a work-affected layer of the outermost surface. Next, in a dent forming process S22, a dent is formed in the central portion of a region where each electronic device is formed, by die forming of a heat press. Next, in a polishing process S23, an upper end face in the vicinity of the dent is polished into a flat mirror surface. Next, in a bonding material deposition process S24, a bonding material formed of, for example, aluminum is deposited on the surface in which the dent is formed, so as to have a thickness of 50 nm to 150 nm by a sputtering method or a vapor deposition method. Next, in a pattern forming process S25, the bonding material is removed from the surface other than the upper end face in the vicinity of the dent by photolithography and an etching method. In this manner, a lid formed of a glass wafer is formed.

An electronic element creating process S30 will be described below. The electronic element is processed into an outer shape by photolithography, an etching method, or dicing in a silicon substrate or the like.

A base substrate forming process S40 will be described below. A plate-shaped glass wafer formed of soda-lime glass is prepared. First, in a polishing, cleaning, and etching process S41, a glass wafer is polished to have a predetermined thickness and is cleaned, and then etching process is performed to remove a work-affected layer of the outermost surface. Next, in the through electrode forming process S1, a through hole is formed in a through-thickness direction of the glass wafer by die forming of a heat press or by installing a mask on the surface and then performing grinding thereon using an etching process or sandblasting. Next, a through electrode formed of a nickel-iron alloy is buried in the through hole. Next, in a grinding process S42, both ends of the through electrode and both faces of the glass wafer are polished to be flattened so that the end face of the through electrode is exposed, thereby forming a base substrate. Next, in a wiring electrode forming process S43, a metal film is deposited on one surface of the base substrate by a sputtering method or a vapor deposition method, and patterning is performed by photolithography and an etching method, thereby forming a wiring electrode.

Next, in the electronic element mounting process S2, the electronic element is mounted on one surface of the base substrate. At the time of the mounting, a conductive adhesive or a metal bump is installed in the wiring electrode of the base substrate, and an electrode of the base substrate is bonded thereto to fix the electronic element onto the base substrate. Thus, the through electrode and the electronic element are electrically connected to each other. In this manner, the base substrate formed of the glass wafer having the plurality of electronic elements mounted thereon is formed.

Next, in a superposition process S11, the lid is placed on the base substrate so that the electronic element is accommodated in each dent of the lid, and pressing is performed from the vertical direction. Next, in the lid installation process S3, the base substrate and the lid are heated to a temperature of 200° C. or higher, and a voltage of several hundreds of V is applied by setting the bonding material of the lid to an anode and setting the base substrate to a cathode, thereby bonding the base substrate and the lid to each other through the bonding material. At the time of the bonding, the vicinity is maintained in a vacuum state.

Next, in the conductive film forming process S4, a conductive film formed of nickel is deposited on the other surface of the base substrate by a vapor deposition method or a sputtering method.

Next, in the paste film forming process S5, a paste film provided with an electrode pattern formed of tin or a tin alloy is deposited on the surface of conductive film 4 by a printing method.

Next, in a cutting process S12, a scribing line is provided on the surface of the assembly, and the assembly is cut by pressing a cutting blade or is divided using a dicing blade or a dicing saw, thereby obtaining the individual electronic devices 1. Next, in an electrical characteristic examination process S13, examination is performed by measuring a resonance frequency, a resonance resistance value, and the like of the electronic device 1.

Meanwhile, a method of manufacturing an electronic device is not limited to this embodiment, and various methods can be adopted.

What is claimed is:

1. An electronic device comprising: an insulating base substrate having two opposed surfaces and in which a plurality of through electrodes are formed; an electronic element which is electrically connected to the through electrodes and which is mounted on one of the two opposed surfaces of the base substrate; a lid which accommodates the electronic element and is bonded to the one surface of the base substrate; and an external electrode which covers a region ranging from an end face of each through electrode, which is exposed at the other of the two opposed surfaces of the base substrate, to the other surface in a vicinity of the end face, wherein the external electrode includes a conductive film which covers a region ranging from the end face to the other surface in the vicinity of the end face, and a paste film which covers a surface of the conductive film and is formed of a conductive paste, and wherein the paste film is a printed paste film formed of tin or a tin alloy.

2. The electronic device according to claim 1, wherein the through electrode are formed of a nickel-iron alloy.

3. The electronic device according to claim 1, wherein a side surface of the conductive film are covered with the paste film.

\* \* \* \* \*